United States Patent [19]

Patel

[11] Patent Number: 4,494,234
[45] Date of Patent: Jan. 15, 1985

[54] ON-THE-FLY MULTIBYTE ERROR CORRECTING SYSTEM

[75] Inventor: Arvind M. Patel, San Jose, Calif.

[73] Assignee: International Business Machines Corporation, Armonk, N.Y.

[21] Appl. No.: 454,393

[22] Filed: Dec. 29, 1982

[51] Int. Cl.$^3$ ............................................. G06F 11/10
[52] U.S. Cl. ...................................................... 371/38
[58] Field of Search ...................... 371/37, 38; 364/200

[56] References Cited

U.S. PATENT DOCUMENTS

| | | | |
|---|---|---|---|
| 4,388,684 | 6/1983 | Nibby, Jr. et al. | 364/200 |
| 4,413,339 | 11/1983 | Riggle et al. | 371/38 |
| 4,453,251 | 6/1984 | Osman | 371/38 X |
| 4,455,655 | 6/1984 | Galen et al. | 371/38 |

*Primary Examiner*—Charles E. Atkinson
*Attorney, Agent, or Firm*—Richard E. Cummins; Henry E. Otto, Jr.

[57] ABSTRACT

An apparatus and method are disclosed for processing syndrome bytes in a multibyte error correcting system in which up to t errors are correctable by processing 2t syndrome bytes. The method involves converting syndrome bytes into t+1 coefficients of the error locator polynomial by predetermined product operations and exclusive-OR operations involving selected syndrome bytes to produce cofactors that correspond to the desired coefficients when less than t errors occurred in the codeword. The cofactors are combined to produce coefficients when t errors occur and the correct set of coefficients are selected in accordance with the number of errors that are detected.

The apparatus involves logical circuitry for obtaining sets of coefficients from selected syndrome bytes where each set is associated with a different number of errors in the codeword and in which a set of coefficients associated with t-1 errors is a cofactor of the set of coefficients associated with t errors.

19 Claims, 6 Drawing Figures

ON-THE-FLY MULTIBYTE ERROR CORRECTING SYSTEM

BACKGROUND OF THE INVENTION

1. Field of Invention

This invention relates in general to error correcting systems and, in particular, to an error correcting system for correcting multibyte errors in a codeword in which the identity of the error locations and the identity of the error patterns are achieved simultaneously.

2. Cross-Referenced Application

Application Ser. No. 454,392, filed concurrently herewith, entitled "Syndrome Processing Unit for Multibyte Error Correcting Systems", A. M. Patel, assigned to the assignee of the present invention, discloses a syndrome processing unit which may be employed in the system of the present invention.

3. Description of the Prior Art

Most data storage subsystems associated with modern information handling systems employ some type of error correction system in order to obtain cost effective design for high reliability and data integrity. The ability of the data processing system to retrieve data from the storage system, i.e., access time, is a well recognized measure of the efficiency of the overall storage system. In most data processing systems, the decoding time for the error correction code is a direct factor in the total access time. As the capacity of storage devices has increased, the need for increased reliability and availability has also increased. As a result, the time required to process soft errors by the error correcting system becomes a larger percentage of the total access time. Multibyte error correcting systems suggested in the prior art require a relatively long time for decoding of the multibyte errors. This has been one of the main objections to their use in high performance storage systems.

The following references disclose basic and significant aspects of prior art error correcting systems:

1. I. S. Reed and G. Solomon, "Polynomial Codes Over Certain Finite Fields", J. Siam, 8 (1960) p. 300–304.

2. R. C. Bose and D. K. Ray-Chaudhuri, "On a Class of Error Correcting Binary Group Codes", Information and Control, 3 (1960) p. 68–79.

3. A Hocquenghem, "Codes Correcteurs d'erreurs", Chiffres (Paris) 2 (1959) p. 147–156.

4. W. W. Peterson, "Encoding and Error Correction Procedures for the Bose-Chaudhuri Codes", IEEE Transaction Information Theory, 6 (1960) p. 459–470.

5. D. C. Gorenstein and N. Zierler, "A Class of Error-Correcting Codes in $p^m$ Symbols", Journal of Soc. Indus. Applied Math. 9 (1961) p. 207–214.

6. E. R. Berlekamp, "On Decoding Binary Bose-Chaudhuri-Hocquenghem Codes", IEEE Trans. Info. Theory 11 (1965) p. 577–579.

7. J. L. Massey, "Step-by-Step Decoding of the Bose-Chaudhuri-Hocquenghem Codes", IEEE Trans. Info. Theory 11 (1965) p. 580–585.

8. R. T. Chien, "Cyclic Decoding Procedure for the Bose-Chaudhuri-Hocquenghem Codes", IEEE Trans. Info. Theory 10 (1964) p. 357–363.

9. G. D. Forney, Jr., "On Decoding BCH Codes", IEEE Trans. Info. Theory 11 (1965) p. 549–557.

10. W. W. Peterson and E. J. Weldon, Jr., *Error Correcting Codes*, 2nd Edition (MIT Press, 1972).

References 1, 2 and 3 provide a wide class of cyclic error correcting codes which are commonly known as Reed-Solomon Codes and BCH Codes. These codes, when defined over nonbinary or extended binary finite fields, can be used for correction of symbol errors as binary byte errors.

References 4 and 5 provide the basic key to the solution of the multi-error decoding problem by suggesting the use of the "error locator polynomial". These references (4 and 5) suggest the use of a set of linear equations to solve for the coefficients of the error locator polynomial. References 6 and 7 suggest the use of an iterative method to compute the coefficients of the error locator polynomial. The roots of the error locator polynomial represent the locations of the symbols in error.

Reference 8 suggests a simple mechanized method, the "Chien Search", for searching these roots using a cyclic trial and error procedure, while reference 9 provides further simplification in the computation of error values in the case of codes with non-binary or higher order binary symbols.

The contribution of the error locator polynomial in references 4 and 5 was significant in that the roots of this polynomial represent the locations of the symbols in error for a multibyte error correcting system. The cross-referenced copending application discloses an improved syndrome processing unit for developing the coefficients of the error locator polynomial.

The method of decoding multibyte errors in a multibyte error correcting system generally comprises four sequential steps:

Step 1—calculating of the error syndromes.

Step 2—determination of the coefficients of the error locator polynomial from the error syndromes.

Step 3—identifying the error locations from the error locator polynomial by "Chien Search".

Step 4—determination of the byte error values for each of the error locations.

All known methods for decoding multiple errors require completion of step 3 before beginning step 4. Because of that situation, prior art systems also require additional hardware to accumulate the results of step 3 for use subsequently by the hardware that implements step 4. References 6 and 10 provide good discussion on the prior art decoding methods.

SUMMARY OF THE INVENTION

The present invention is directed to an error correcting system in which the problems of the prior art have been eliminated.

In accordance with the present invention, an error correcting system is provided in which steps 3 and 4 of the decoding procedure for multibyte errors are completed simultaneously. In particular, the location and value of each error are computed in cyclic order without the explicit information regarding the locations of the remaining errors which are yet to be determined. Step 3, which involves the "Chien Search" function is expanded into a complete mechanization of the error correcting procedure, and as a result, data characters in the codeword can be transferred from the error correcting system to the data processing system one at a time in synchronism with each cycle of the Chien Search. The access time to the first byte of data is, therefore, not impacted by the time required for the identification of the error locations and development of the error values for the errors. The hardware of the error correcting system is also highly simplified since the results of step 3 which normally had to be stored no longer need to be stored. The same set of hardware obtains the error values and the correction for all errors at the appropriate cycle during the Chien Search even when the actual number of errors is less than the designed maximum. Such an arrangement was only possible in prior art single symbol correcting codes.

The improved system also avoids all division operations in obtaining the coefficients of the error location equation when the syndrome processing unit disclosed in the copending application is employed in connection with the error pattern processing circuits of the present invention.

As discussed in the copending application, the situation where less than the maximum number of errors are present in the code word results in additional simplification of the hardware which becomes important when the circuitry of the error correcting system is being implemented in very large scale integration. The simplification is important in that when the circuitry has been implemented in VLSI to operate with 2t input syndrome bytes, the same VLSI circuitry can be used in environments which provide less than 2t input syndrome bytes.

It is, therefore, an object of the present invention to provide a multibyte error correcting system which has a minimal effect on the access time of an associated data storage system.

A further object of the present invention is to provide a multibyte error correcting system in which the transfer of the codeword from the error correcting system is initiated prior to the time that the identity of all the error locations is known. A still further object of the present invention is to provide a multibyte error correcting system in which the location and error pattern of each byte of the codeword that is in error is simultaneously identified as bytes are being transferred from the error correcting system so that errors are corrected on-the-fly.

A further object of the present invention is to provide an ECC system which is operable to correct any number of errors up to the maximum number for which it has been designed so that the same hardware may be employed to correct less than the maximum number of errors in one application or, alternately, employed with a different application which employs a fewer number of check bytes and syndrome bytes.

A further object of the present invention is to provide an ECC system in which only one inverse operation is involved in developing the error patterns.

The foregoing and other objects, features and advantages of the invention will be apparent from the following more particular description of a preferred embodiment of the invention as illustrated in the accompanying drawing.

DESCRIPTION OF THE PREFERRED EMBODIMENT

Figure 1:
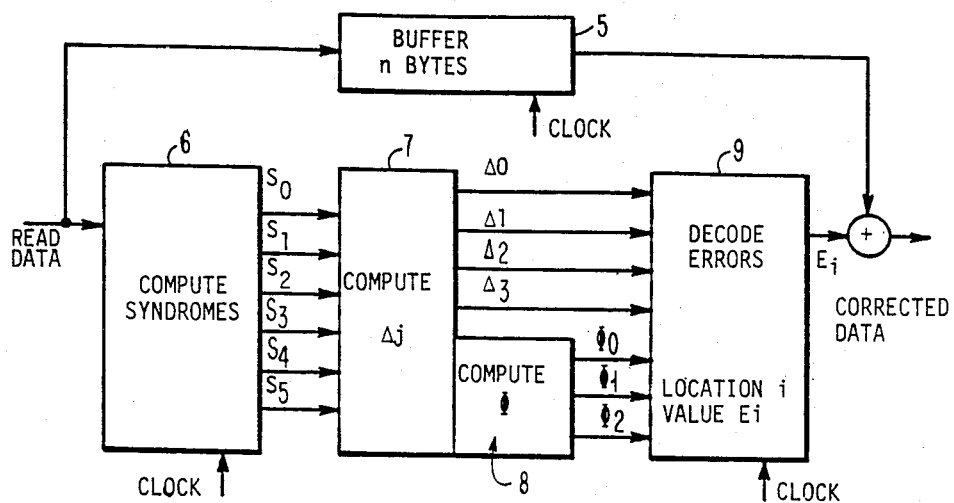
FIG. 1 is a block diagram of a multibyte error correcting system embodying the present invention.

A description of the system shown in FIG. 1 will first be provided. The description of the syndrome processing logic for identifying error locations and the method of operating the logic will then be followed by a mathematical explanation and proof of the manner in which the logic has been implemented. This explanation will describe in mathematical terms the operation of the error correcting system for the general case of any number of errors.

FIG. 1 shows the block diagram of an on-the-fly ECC system which includes the syndrome processing logic disclosed and claimed in the copending application Ser. No. 454,392, filed concurrently herewith and assigned to the assignee of the present invention. As described in that application, the syndrome processing unit developes the coefficients for the error locator equation. The correcting process of the FIG. 1 system is continuous. An uninterrupted stream of data enters and leaves the decoder in the form of a chain of n-symbol codewords, hence the name, on-the-fly decoding. From a practical viewpoint, a given decoding process can be considered on-the-fly if it meets the following test, namely, the corrected data bytes of a previously received codeword are delivered to the user system while the data bytes of the following codeword are being received.

The decoder, comprising blocks 6, 7, 8, 9, computes syndromes for the incoming codeword as it decodes and corrects errors in the previously received outgoing codeword. Each clock cycle corresponds to an input of one data symbol of the incoming codeword concurrent with an output of one corrected data symbol of the outgoing codeword. A buffer 5 holds at least n-symbols of the uncorrected data in between the incoming and outgoing symbols.

Figure 3:
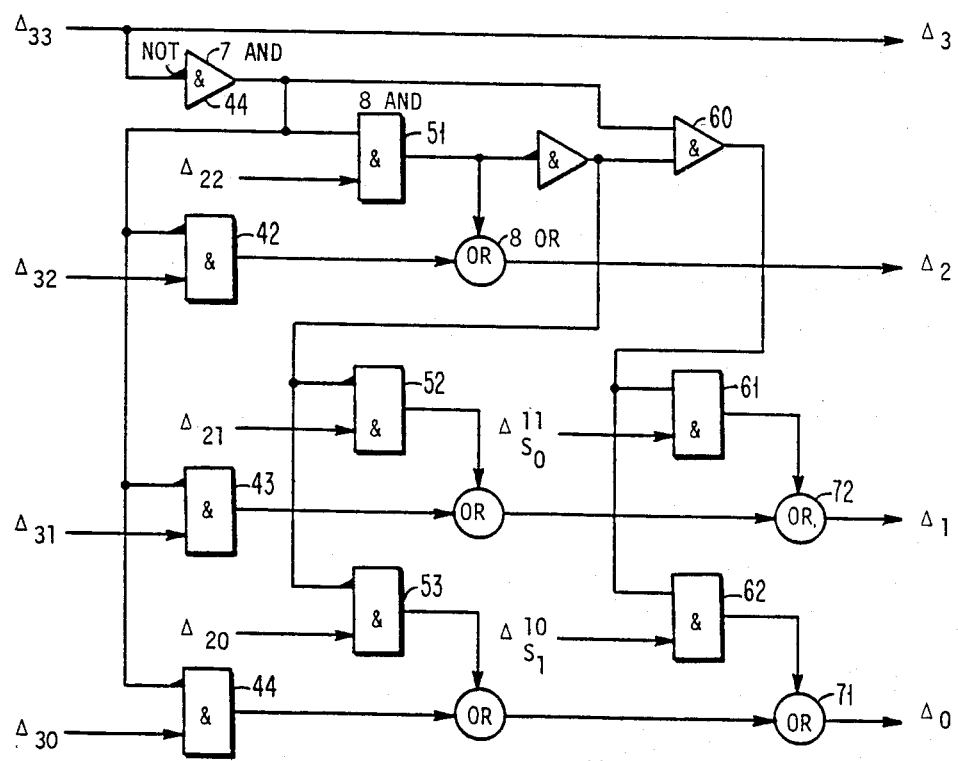
FIGS. 2 and 3 are schematic diagrams of the syndrome processing unit shown in FIG. 1 for developing the error locator coefficients $\Delta$ of the error locator polynomial.
Figure 2:
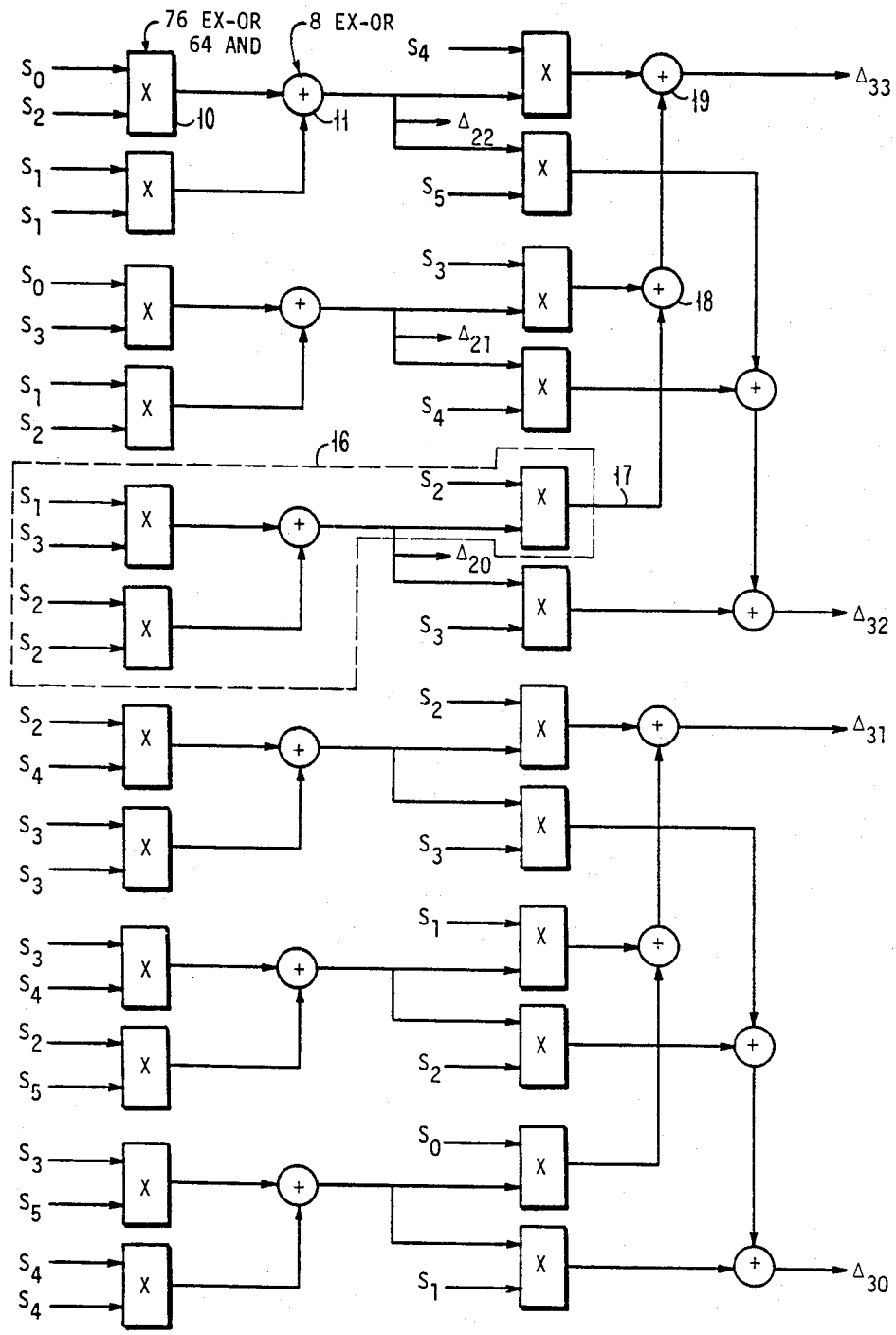

A three-error correcting Reed-Solomon Code in $GF(2^8)$ is used as an example of special interest for applications in computer products. The 256 elements of $GF(2^8)$ are conventionally represented by the set of 8-bit binary vectors. One such representation is given in Table 1. In a three-error correcting Reed-Solomon code, there are six check symbols corresponding to the roots $\alpha^0$, $\alpha^1$, $\alpha^2$, $\alpha^3$, $\alpha^4$, $\alpha^5$ of the generator polynomial where $\alpha$ is an element of a finite field $GF(2^8)$ and is represented by an 8-bit binary vector. The corresponding syndromes computed by block 6 are denoted by $S_0$, $S_1$, $S_2$, $S_3$, $S_4$, and $S_5$ respectively. These syndromes are computed from the received codeword in the conventional manner in accordance with any known prior art process. The implementation for this step is well known and makes use of exclusive-OR circuits and shift registers. The details of the block 7 logic circuits are shown in FIGS. 2 and 3.

Table 1

```
  P
1 1 0 1 0 1 0 0 1
```

| GF256 | P | | | | | | | | |
|---|---|---|---|---|---|---|---|---|---|
| 000 | 00000001 | 051 | 11011100 | 102 | 00101010 | 153 | 11101100 | 204 | 00011011 |
| 001 | 00000010 | 052 | 00010001 | 103 | 01010100 | 154 | 01110001 | 205 | 00110110 |
| 002 | 00000100 | 053 | 00100010 | 104 | 10101000 | 155 | 11100010 | 206 | 01101100 |
| 003 | 00001000 | 054 | 01000100 | 105 | 11111001 | 156 | 01101101 | 207 | 11011000 |
| 004 | 00010000 | 055 | 10001000 | 106 | 01011011 | 157 | 11011010 | 208 | 00011001 |
| 005 | 00100000 | 056 | 10111001 | 107 | 10110110 | 158 | 00011101 | 209 | 00110010 |
| 006 | 01000000 | 057 | 11011011 | 108 | 11000101 | 159 | 00111010 | 210 | 01100100 |
| 007 | 10000000 | 058 | 00011111 | 109 | 00100011 | 160 | 01110100 | 211 | 11001000 |
| 008 | 10101001 | 059 | 00111110 | 110 | 01000110 | 161 | 11101000 | 212 | 00111001 |
| 009 | 11111011 | 060 | 01111100 | 111 | 10001100 | 162 | 01111001 | 213 | 01110010 |
| 010 | 01011111 | 061 | 11111000 | 112 | 10110001 | 163 | 11110010 | 214 | 11100100 |
| 011 | 10111110 | 062 | 01011001 | 113 | 11001011 | 164 | 01001101 | 215 | 01100001 |
| 012 | 11010101 | 063 | 10110010 | 114 | 00111111 | 165 | 10011010 | 216 | 11000010 |
| 013 | 00000011 | 064 | 11001101 | 115 | 01111110 | 166 | 10011101 | 217 | 00101101 |
| 014 | 00000110 | 065 | 00110011 | 116 | 11111100 | 167 | 10010011 | 218 | 01011010 |
| 015 | 00001100 | 066 | 01100110 | 117 | 01010001 | 168 | 10001111 | 219 | 10110100 |
| 016 | 00011000 | 067 | 11001100 | 118 | 10100010 | 169 | 10110111 | 220 | 11000001 |
| 017 | 00110000 | 068 | 00110001 | 119 | 11101101 | 170 | 11000111 | 221 | 00101011 |
| 018 | 01100000 | 069 | 01100010 | 120 | 01110011 | 171 | 00100111 | 222 | 01010110 |
| 019 | 11000000 | 070 | 11000100 | 121 | 11100110 | 172 | 01001110 | 223 | 10101100 |
| 020 | 00101001 | 071 | 00100001 | 122 | 01100100 | 173 | 10011100 | 224 | 11110001 |
| 021 | 01010010 | 072 | 01000010 | 123 | 11001010 | 174 | 10000001 | 225 | 01001011 |
| 022 | 10100100 | 073 | 10000100 | 124 | 00111101 | 175 | 10001011 | 226 | 10010110 |
| 023 | 11100001 | 074 | 10100001 | 125 | 01111010 | 176 | 10111111 | 227 | 10000101 |
| 024 | 01101011 | 075 | 11101011 | 126 | 11110100 | 177 | 11010111 | 228 | 10100011 |
| 025 | 11010110 | 076 | 01111111 | 127 | 01000001 | 178 | 00000111 | 229 | 11101111 |
| 026 | 00000101 | 077 | 11111110 | 128 | 10000010 | 179 | 00001110 | 230 | 01110111 |
| 027 | 00001010 | 078 | 01010101 | 129 | 10101101 | 180 | 00011100 | 231 | 11101110 |
| 028 | 00010100 | 079 | 10101010 | 130 | 11110011 | 181 | 00111000 | 232 | 01110101 |
| 029 | 00101000 | 080 | 11111101 | 131 | 01001111 | 182 | 01110000 | 233 | 11101010 |
| 030 | 01010000 | 081 | 01010011 | 132 | 10011110 | 183 | 11100000 | 234 | 01111101 |
| 031 | 10100000 | 082 | 10100110 | 133 | 10010101 | 184 | 01101001 | 235 | 11111010 |
| 032 | 11101001 | 083 | 10110101 | 134 | 10000011 | 185 | 11010010 | 236 | 01011101 |
| 033 | 01111011 | 084 | 01100011 | 135 | 10101111 | 186 | 00001101 | 237 | 10111010 |
| 034 | 11110110 | 085 | 11000110 | 136 | 11110111 | 187 | 00011010 | 238 | 11011101 |
| 035 | 01000101 | 086 | 00100101 | 137 | 01000111 | 188 | 00110100 | 239 | 00010011 |
| 036 | 10001010 | 087 | 01001010 | 138 | 10001110 | 189 | 01101000 | 240 | 00100110 |
| 037 | 10111101 | 088 | 10010100 | 139 | 10110101 | 190 | 11010000 | 241 | 01001100 |
| 038 | 11010011 | 089 | 10000001 | 140 | 11000011 | 191 | 00001001 | 242 | 10011000 |
| 039 | 00001111 | 090 | 10101011 | 141 | 00101111 | 192 | 00010010 | 243 | 10011001 |
| 040 | 00011110 | 091 | 11111111 | 142 | 01011110 | 193 | 00100100 | 244 | 10011011 |
| 041 | 00111100 | 092 | 01010111 | 143 | 10111100 | 194 | 01001000 | 245 | 10011111 |
| 042 | 01111000 | 093 | 10101110 | 144 | 11010001 | 195 | 10010000 | 246 | 10010111 |
| 043 | 11110000 | 094 | 11110101 | 145 | 00001011 | 196 | 10001001 | 247 | 10000111 |
| 044 | 01001001 | 095 | 01000011 | 146 | 00010110 | 197 | 10111011 | 248 | 10100111 |
| 045 | 10010010 | 096 | 10000110 | 147 | 00101100 | 198 | 11011111 | 249 | 11100111 |
| 046 | 10001101 | 097 | 10100101 | 148 | 01011000 | 199 | 00010111 | 250 | 01100111 |
| 047 | 10110011 | 098 | 11100011 | 149 | 10110000 | 200 | 00101110 | 251 | 11001110 |
| 048 | 11001111 | 099 | 01101111 | 150 | 11001001 | 201 | 01011100 | 252 | 00110101 |
| 049 | 00110111 | 100 | 11011110 | 151 | 00111011 | 202 | 10111000 | 253 | 01101010 |
| 050 | 01101110 | 101 | 00010101 | 152 | 01110110 | 203 | 11011001 | 254 | 11010100 |

The overall function of the block 7, shown in FIGS. 2 and 3, is first to implement the following four equations in FIG. 2 to develop the locator parameters $\Delta_{33}$, $\Delta_{32}$, $\Delta_{31}$ and $\Delta_{30}$ for the three error case, which also includes the parameters $\Delta_{22}$, $\Delta_{21}$ and $\Delta_{20}$ for the two error case where, for example, the subscript 33 identifies one of four parameters. From these locator parameters, the coefficients $\Delta_3$, $\Delta_2$, $\Delta_1$ and $\Delta_0$ are selected by the logic shown in FIG. 3 in accordance with the exact number of errors that are involved in the particular codeword. The equations for $\Delta_{33}$, $\Delta_{32}$, $\Delta_{31}$ and $\Delta_{30}$ are as follows:

$$\Delta_{33} = S_2(S_1S_3 \oplus S_2S_2) \oplus S_3(S_0S_3 \oplus S_1S_2) \oplus S_4(S_1S_1 \oplus S_2S_0) \tag{1}$$

$$\Delta_{32} = S_3(S_1S_3 \oplus S_2S_2) \oplus S_4(S_0S_3 \oplus S_1S_2) \oplus S_5(S_1S_1 \oplus S_2S_0) \tag{2}$$

$$\Delta_{31} = S_0(S_4S_4 \oplus S_3S_5) \oplus S_1(S_3S_4 \oplus S_2S_5) \oplus S_2(S_3S_3 \oplus S_2S_4) \tag{3}$$

$$\Delta_{30} = S_1(S_4S_4 \oplus S_3S_5) \oplus S_2(S_3S_4 \oplus S_2S_5) \oplus S_3(S_3S_3 \oplus S_2S_4) \tag{4}$$

These parameters are used to determine the coefficients of the error locator equation (17). The error locations and error patterns are then determined by the blocks 8 and 9 of the "on-the-fly" system shown in FIG. 1. The details of block 7 are shown in FIGS. 2 and 3.

The combinatorial logic shown in FIG. 2 includes two basic logic blocks 10 and 11. The first block 10, represented by an X, corresponds to a product operation in GF($2^8$) involving two 8-bit binary vectors, while the second block 11 represents a sum operation in GF($2^8$) involving two 8-bit binary vectors. The operation of block 11 is a simple bit-by-bit exclusive-OR logical function using eight 2-way exclusive-OR gates. The product operation, on the other hand, represented by block 10 is more complex and involves 71 exclusive-OR circuits and 64 AND circuits. The need for the 71 XOR circuits and 64 AND circuits may be seen from the following explanation of the product function of block 10.

The product operation of block 10 involves two 8-bit vectors A and B to produce a third vector C where $$A = [a_0, a_1, a_2, a_3, a_4, a_5, a_6, a_7]$$
$$B = [b_0, b_1, b_2, b_3, b_4, b_5, b_6, b_7]$$
$$C = [c_0, c_1, c_2, c_3, c_4, c_5, c_6, c_7]$$

The product is obtained through a two step process. First, compute the coefficients $f_i$ of the product polynomial F where $F = A \times B$, modulo 2. Computation of the coefficients $f_i$ ($i = 0, \ldots 14$) requires 64 AND gates and 49 EX-OR gates:

$$f_0 = a_0 b_0$$

$$f_1 = a_0 b_1 \oplus a_1 b_0$$

$$f_2 = a_0 b_2 \oplus a_1 b_1 \oplus a_2 b_0$$

$$f_3 = a_0 b_3 \oplus a_1 b_2 \oplus a_2 b_1 \oplus a_3 b_0$$

. . .

$$f_7 = a_0 b_7 \oplus a_1 b_6 \oplus a_2 b_5 \oplus \ldots \oplus a_6 b_1 \oplus a_7 b_0$$

$$f_8 = a_1 b_7 \oplus a_2 b_6 \oplus a_3 b_5 \oplus \ldots \oplus a_7 b_1$$

. . .

$$f_{13} = a_6 b_7 \oplus a_7 b_6$$

$$f_{14} = a_7 b_7$$

Second, reduce the polynomial F, modulo p(x), where p(x) is a primitive binary polynomial of degree 8. Use $p(x) = 1 + x^3 + x^5 + x^7 + x^8$. The reduction of $f_i$ modulo p(x) requires at the most 22 EX-OR gates.

$$C_0 = f_0 \oplus f_8 \oplus f_9 \oplus f_{10} \oplus f_{12} \oplus f_{13}$$

$$C_1 = f_1 \oplus f_9 \oplus f_{10} \oplus f_{11} \oplus f_{13} \oplus f_{14}$$

$$C_2 = f_2 \oplus f_{10} \oplus f_{11} \oplus f_{12} \oplus f_{14}$$

$$C_3 = f_3 \oplus f_8 \oplus f_9 \oplus f_{10} \oplus f_{11}$$

$$C_4 = f_4 \oplus f_9 \oplus f_{10} \oplus f_{11} \oplus f_{12}$$

$$C_5 = f_5 \oplus f_8 \oplus f_9 \oplus f_{11}$$

$$C_6 = f_6 \oplus f_9 \oplus f_{10} \oplus f_{12}$$

$$C_7 = f_7 \oplus f_8 \oplus f_9 \oplus f_{11} \oplus f_{12}$$

The implementation of the product process involves one 2-input AND-gate for each product term required for the coefficient $f_0$ through $f_{14}$ and a 2-input exclusive-OR gate for combining the outputs of the AND-gates. Each block 10, therefore, represents 64 AND-gates, 71 exclusive-OR gates.

The first term of the error locator polynomial $S_2(S_1, S_3 \oplus S_2, S_2)$ of the $\Delta_{33}$ equation is implemented by dashed block 16 in FIG. 2. The output of block 16 is exclusive-ORed in gate 18 with the second term of the equation and the result exclusive-ORed in gate 19 with the last term of the equation.

The blocks involved in developing each of the other parameters $\Delta_{32}$, $\Delta_{31}$ and $\Delta_{30}$ may be traced in a similar manner in FIG. 2.

The parameters $\Delta_{22}$, $\Delta_{21}$ and $\Delta_{20}$ for the case when only two errors occur are cofactors in equation (1) for $\Delta_{33}$. These cofactors are:

$$\Delta_{22} = S_1 S_1 \oplus S_2 S_0 \qquad (5)$$

$$\Delta_{21} = S_0 S_3 \oplus S_1 S_2 \qquad (6)$$

$$\Delta_{20} = S_1 S_3 \oplus S_2 S_2 \qquad (7)$$

In FIG. 2, the computations for $\Delta_{22}$, $\Delta_{21}$ and $\Delta_{20}$ are shown as the interim byproducts within the computations for $\Delta_{33}$. Similarly, $\Delta_{11}$ and $\Delta_{10}$ are cofactors in equation (48) for $\Delta_{22}$ which are given by $$\Delta_{11} = S_0 \qquad (8)$$

$$\Delta_{10} = S_1 \qquad (9)$$

It is shown later in the specification how the equations for developing locator parameters are derived from the following prior art relationship of the error locator polynomial with the syndromes.

$$\begin{bmatrix} S_0 & S_1 & S_2 \\ S_1 & S_2 & S_3 \\ S_2 & S_3 & S_4 \end{bmatrix} \begin{bmatrix} \sigma_0 \\ \sigma_1 \\ \sigma_2 \end{bmatrix} = \sigma_3 \begin{bmatrix} S_3 \\ S_4 \\ S_5 \end{bmatrix} \qquad (10)$$

FIG. 3 illustrates the logic for selecting the coefficients of the error locator polynomial from the locator parameters $\Delta_{33}$ through $\Delta_{30}$ and the cofactors $\Delta_{22}$ through $\Delta_{10}$. The FIG. 3 logic functions to identify the number of errors from the input parameters $\Delta_{33}$ through $\Delta_{30}$ and the cofactors $\Delta_{22}$ through $\Delta_{10}$ and select the appropriate value $\Delta_m$ in the general equation $$\Delta_m = \begin{bmatrix} \Delta_{mm} \text{ for } m > v \\ \Delta_{vm} \text{ for } m \leq v \end{bmatrix} \qquad (11)$$

When $\Delta_{33}$ is non-zero, indicating the presence of three errors, the coefficients $\Delta_3$ through $\Delta_0$ will assume the values $\Delta_{33}$ through $\Delta_{30}$. As shown, when $\Delta_{33}$ is non-zero, the output of AND-gate 41 is low, permitting the $\Delta_{32}$, $\Delta_{31}$ and $\Delta_{30}$ signals to be gated through AND-gates 42, 43 and 44 respectively since the output of AND-gate 41 is inverted at the input to each gate 42–44 to enable each of the AND-gates.

A similar logic function is achieved by $\Delta_{22}$ if $\Delta_{33}$ is zero indicating not more than two errors are present. In such a situation, $\Delta_2$, $\Delta_1$ and $\Delta_0$ will take the values of $\Delta_{22}$, $\Delta_{21}$ and $\Delta_{20}$ respectively through the operation of AND-gates 51, 52 and 53 respectively. This function corresponds to the syndrome equation for two errors.

The logic circuitry of FIG. 3 functions similarly if $\Delta_2$ is also zero to cause $\Delta_1$ and $\Delta_0$ to assume the values of $\Delta_{11}$ and $\Delta_{10}$. AND-gates 61 and 62 gate $\Delta_{11}$ and $\Delta_{10}$ respectively through OR-gates 71, 72 if $\Delta_{33}$ and $\Delta_{22}$ are both zero since AND-gate 60 provides the enabling signal.

The overall logic of FIG. 3, therefore, functions to produce or to select the correct values of the coefficients $\Delta_3$, $\Delta_2$, $\Delta_1$ and $\Delta_0$ for the error locator equations from the locator parameters developed by the logic of FIG. 2.

The hardware for developing the coefficients $\Phi$ of the error value equation which is expressed as follows $$E_i = \left( \sum_{m=0}^{t-1} \Phi_m \alpha^{mi} \right) / \left( \sum_{m=0}^{t} \Delta_m \alpha^{mi} \right) \quad (12)$$

$m$ even (or $m$ odd)

will now be described. The error value equation for the generic case is developed later in the specification. The general equation can be converted to the specific three byte error correcting system set forth in the drawings such that the coefficients may be defined as $$\Phi_0 = \Delta_0 S_0 \quad (13)$$

$$\Phi_1 = \Delta_2 S_1 \oplus \Delta_3 S_2 \quad (14)$$

$$\Phi_2 = \Delta_3 S_1 \quad (15)$$

Figure 4:
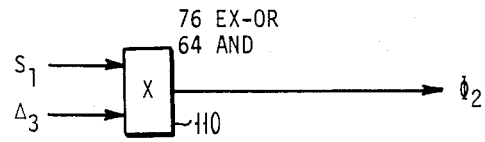
FIG. 4 is a schematic logic diagram of the logic for generating the coefficients $\Phi$ for the error value expression.
Figure 4:
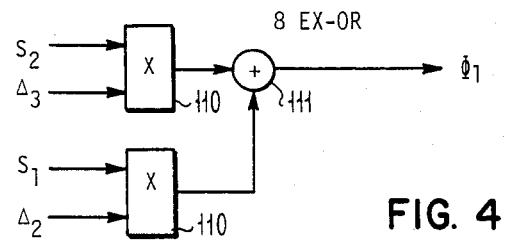
Figure 4:
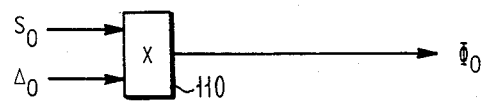
Figure 5:
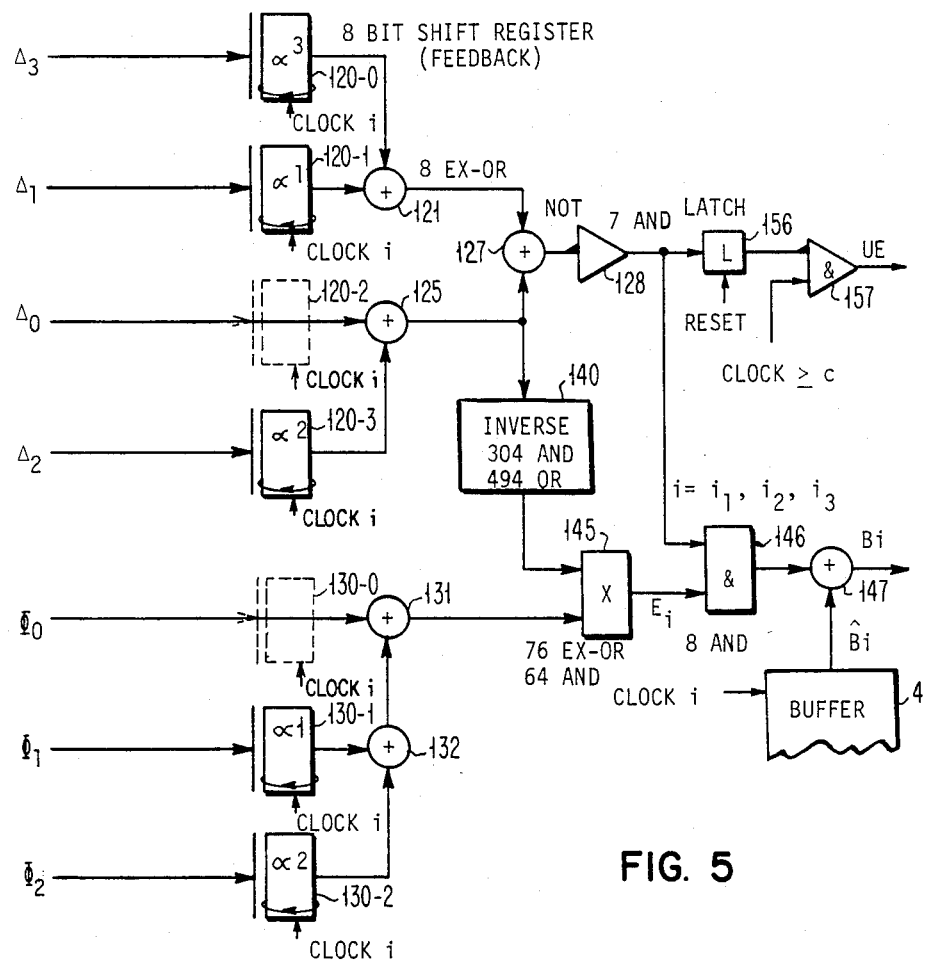
FIG. 5 is a schematic diagram of the circuitry for implementing the error search, determination of the error value, and delivery of data with on-the-fly correction of the erroneous bytes.

The logic circuitry of FIG. 4 in effect implements the above three equations and comprises two basic logic blocks 110 and 111. Block 110 functions to provide the product function of the two 8-bit vectors and is identical to block 10 described earlier in connection with FIG. 2. Block 111 is a sum function of two 8-bit vectors and is identical to block 11 described earlier in FIG. 2. With the error value coefficients $\Phi$ and the error location coefficients $\Delta$ being developed, the circuitry of FIG. 5 is employed to mechanize the trial and error systematic search, i.e., the Chien Search, for the actual error locations and error patterns. The circuit of FIG. 5 functions to implement the error value equation when that equation is rewritten as $$E_i = \frac{\Phi_2 \alpha^{2i} \oplus \Phi_1 \alpha^i \oplus \Phi_0}{\Delta_3 \alpha^{3i} \oplus \Delta_1 \alpha^i} \quad (16)$$

As shown, FIG. 5 comprises four feedback shift registers 120-0, 120-1, 120-2 and 120-3 which receive the error location coefficients and three feedback shift registers 130-0, 130-1 and 130-2 which receive the three error pattern coefficients. The block labelled 120 implements the following equation $$\Delta_3 \alpha^{3i} \oplus \Delta_2 \alpha^{2i} \oplus \Delta_1 \alpha^i \oplus \Delta_0 = 0 \text{ for } i \in \{I\} \quad (17)$$

while block 130 implements the numerator of equation 16. The denominator of equation 16 is developed by the inverse block 140 from the output of exclusive-OR gate 125 which is one term developed for equation 17. The function and details of the inverse block 140 are discussed further on in the specification. The output of the exclusive-OR gate 127 functions through AND-gate 128 to provide an indication of an uncorrectable error condition which, depending on the length of the codeword, would occur in some cases if the number of errors exceeds the designed correction capability of the code.

The product block 145 multiples the two 8-bit vectors in a manner identical to product blocks 110 and 10 described earlier and comprises 76 exclusive-OR gates and 64 AND-gates, each of which are 2-input gates.

The output of product block 145 is the error pattern $E_i$ supplied to AND-block 146 comprising eight 2-input AND-gates. The error pattern vector $E_i$ supplied to gate 146 is supplied to exclusive-OR block 147 only when the error locator logic indicates that the output of exclusive-OR block 127 is zero. The other input to exclusive-OR block 147 is from buffer 4.

As shown in FIG. 5, a clock signal C is supplied to the shift registers and buffers so that the bytes of data in error are each supplied to exclusive-OR block 147 at the appropriate time determined by the recognition that the error is located as indicated by a zero at the output of exclusive-OR block 127, thereby signifying that the output of the product block 145 contains the correct error pattern for that byte position.

The operation of the FIG. 5 circuitry is as follows. The computed values of the coefficients $\Delta_3$, $\Delta_2$, $\Delta_1$ and $\Delta_0$ and $\Phi_2$, $\Phi_1$ and $\Phi_0$ are entered into the appropriate shift registers at clock 0 time. Each clock cycle generates a shifting operation of these registers. A shifting operation multiplies the contents of each register by a specific constant, namely $\alpha_3$, $\alpha_2$ and $\alpha$, in the case of the shift registers for $\Delta_3$, $\Delta_2$, and $\Delta_1$ respectively and $\alpha_2$ and $\alpha$ in the case of registers of $\Phi_2$ and $\Phi_1$ respectively. At the $i^{th}$ clock cycle, the upper set of exclusive-OR circuits 121, 125 and 127 in FIG. 5 at the output of shift registers 120 are presented with all the terms of equation 17. When the sum is 0, equation 17 is satisfied and one error location is identified. Similarly, at the $i^{th}$ clock cycle, the lower set of exclusive-OR circuits 131, 132 at the output of shift registers 130 are presented with all the terms of the numerator in equation 16. The denominator for equation 16 is readily available, as mentioned previously, from exclusive-OR circuit 125. Block 140 for an inverse operation and block 146 for the product operation compute the error pattern $E_i$ for each position in accordance with equation 16.

The algebraic inverse in $GF(2^8)$ can be obtained through combinational logic which maps each 8-digit binary sequence into a specific 8-digit binary sequence. This mapping requires, at the most, 304 two-terminal AND-gates and 494 two-terminal OR-gates. The method of developing the inverse is shown later on in the specification. When the error location is identified, data character from buffer 4 is modified by $E_i$ through the output-sum network 146–147. For all other values of i, the computed value of $E_i$ is ignored since AND-gate 146 is closed. When all bytes of the codeword are delivered (at the final clock cycle c), if an error location was not identified in spite of nonzero syndromes, then there are too many errors. The latch 156 and AND-gate 157 indicates this with an UE (uncorrectable error) signal.

It will be noted that corrected bytes in the decoder of FIG. 5 are delivered in the order $B_0, B_1, B_2, \ldots, B_{c-1}$. This is the reverse order compared to that in the encoding operation since the check bytes correspond to the low-order positions.

Figure 6:
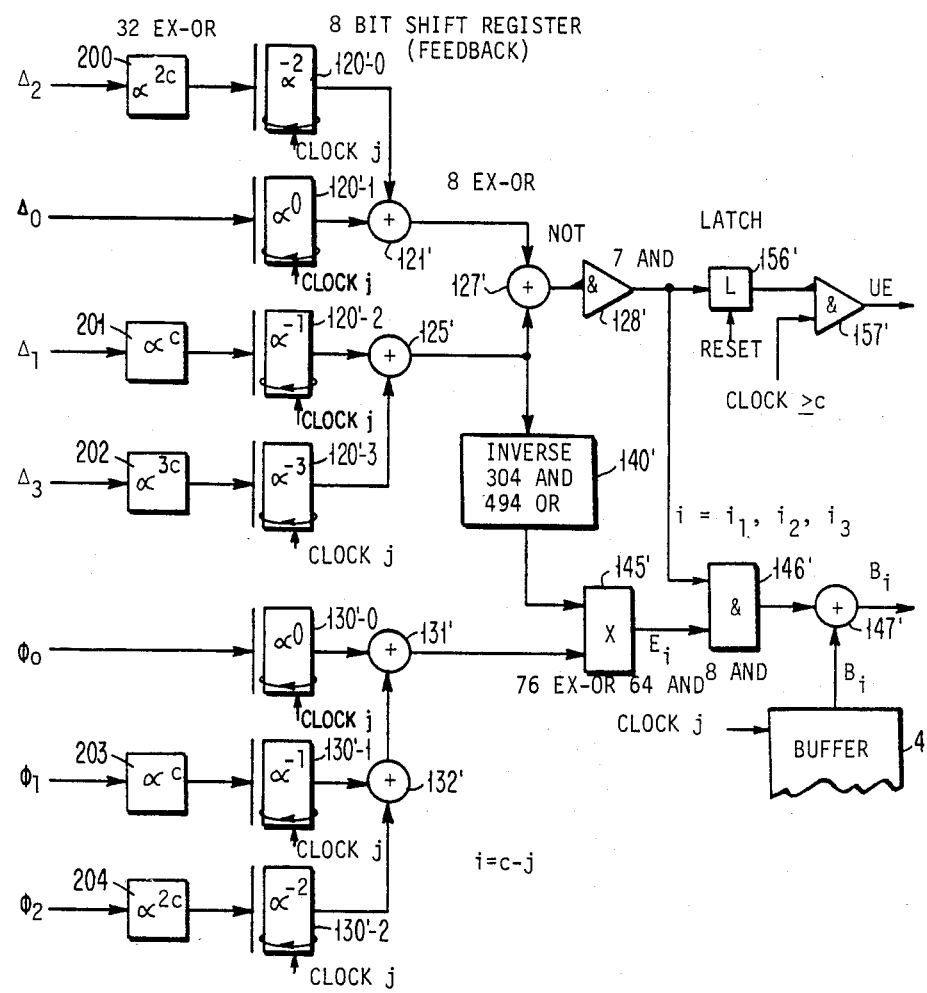
FIG. 6 is a schematic diagram constituting a modification of the circuitry shown in FIG. 5 in which the order of delivery of the codeword bytes is the reverse of that shown in FIG. 5.

According to a modification of the circuitry shown in FIG. 5 and as illustrated in FIG. 6, this reversal can easily be removed. This is achieved by introducing a reversal relationship between clock cycle count j and the byte location number i by substituting $(c-j)$ for i in the decoding equations 17 and 16 and rewriting them as $$(\Delta_3 \alpha^{3c}) \alpha^{-3j} \oplus (\Delta_2 \alpha^{2c}) \alpha^{-2j} \oplus (\Delta_1 \alpha^c) \alpha^{-j} \oplus \Delta_0 = 0 \quad (18)$$

$$E_{(c-j)} = \frac{(\Phi_2 \alpha^{2c}) \alpha^{-2j} \oplus (\Phi_1 \alpha^c) \alpha^{-j} \oplus \Phi_0}{(\Delta_3 \alpha^{3c}) \alpha^{-3j} \oplus (\Delta_1 \alpha^c) \alpha^{-j}} \quad (19)$$

In these equations, j represents the clock cycle count, and $j=1$ to c, successively, correspond to the byte-position values $i=(c-1)$ to 0. This provides delivery of bytes in the order $B_{c-1}, \ldots, B_1, B_0$, which is the same as that in the encoding process.

In FIG. 6, the similar circuits are identified by reference numerals which are identical with those in FIG. 5 except primed; and new reference numerals are applied only to added circuits.

To accomplish the above-mentioned modification, the following chages are made in the logic of FIG. 5: (1) the shift register multipliers $\alpha^3$, $\alpha^2$, and $\alpha$ are replaced by $\alpha^{-3}$, $\alpha^{-2}$, and $\alpha^{-1}$, respectively (see shift register elements 120'-0, 120'-2 and 120'-3 and also 130'-1 and 130'-2); (2) the coefficients $\Delta_3$, $\Delta_2$, $\Delta_1$, $\Phi_2$, and $\Phi_1$ are premultiplied by the constants $\alpha^{3c}$, $\alpha^{2c}$, $\alpha^c$, $\alpha^{2c}$, and $\alpha^c$, respectively. These premultiplication circuits 200–204 depend on the value of c and each requires a small number of exclusive-OR gates. Note that when $c=255$, this premultiplication is not needed since $\alpha^{255}=1$. The modified logic described above appears in FIG. 6.

The following is the mathematical deriviation for the equations used in the logic implementation of FIGS. 2 and 3.

In the three-error correcting Reed-Solomon Code in $GF(2^8)$ there are six check symbols corresponding to the roots $\alpha^0$, $\alpha^1$, $\alpha^2$, $\alpha^3$, $\alpha^4$, $\alpha^5$ of the generator polynomial. The corresponding syndromes are denoted by $S_0$, $S_1$, $S_2$, $S_3$, $S_4$ and $S_5$ respectively.

We assume that, at the most, three symbols are in error. The error values are denoted by $E_{i1}$, $E_{i2}$ and $E_{i3}$ and the locations of erroneous symbols are denoted by $i_1$, $i_2$ and $i_3$. Then the relationships between the syndromes and the errors are given by $$S_j = \alpha^{ji_1} E_{i1} \oplus \alpha^{ji_2} E_{i2} \oplus \alpha^{ji_3} E_{i3} \quad (1A)$$

for $j=0, 1, 2, 3, 4, 5$.

Consider the polynomial with roots at $\alpha^{i_1}$, $\alpha^{i_2}$ and $\alpha^{i_3}$. This is called error locator polynomial, given by $$(x \oplus \alpha^{i_1})(x \oplus \alpha^{i_2})(x \oplus \alpha^{i_3}) = x^3 \oplus \sigma_2 x^2 \oplus \sigma_1 x \oplus \sigma_0 \quad (2A)$$

Substituting $x = \alpha^i$ in (2A) we get $$\alpha^{3i} \oplus \sigma_2 \alpha^{2i} \oplus \sigma_1 \alpha^i \oplus \sigma_0 = 0 \quad (3A)$$

for $i = i_1, i_2$ and $i_3$.

From equations (1A) and (3A), we can derive the following relationship between the syndromes $S_j$ and the coefficients $\sigma_i$ of the error location polynomial.

$$\begin{bmatrix} S_0 & S_1 & S_2 \\ S_1 & S_2 & S_3 \\ S_2 & S_3 & S_4 \end{bmatrix} \begin{bmatrix} \sigma_0 \\ \sigma_1 \\ \sigma_2 \end{bmatrix} = \begin{bmatrix} S_3 \\ S_4 \\ S_5 \end{bmatrix} \quad (4A)$$

We can solve Equation (4A) and obtain $\sigma_0$, $\sigma_1$ and $\sigma_2$ as $$\sigma_0 = \frac{\Delta_{30}}{\Delta_{33}}, \quad \sigma_1 = \frac{\Delta_{31}}{\Delta_{33}} \text{ and } \sigma_2 = \frac{\Delta_{32}}{\Delta_{33}} \quad (5A)$$

where $\Delta_{33}$, $\Delta_{32}$, $\Delta_{31}$ and $\Delta_{30}$ are given by $$\Delta_{33} = S_2(S_1 S_3 \oplus S_2 S_2) \oplus S_3(S_0 S_3 \oplus S_1 S_2) \oplus S_4(S_1 S_1 \oplus S_2 S_0) \quad (6A)$$

$$\Delta_{32} S_3(S_1 S_3 \oplus S_2 S_2) \oplus S_4(S_0 S_3 \oplus S_1 S_2) \oplus S_5(S_1 S_1 \oplus S_2 S_0) \quad (7A)$$

$$\Delta_{31} = S_0(S_4 S_4 \oplus S_3 S_5) \oplus S_1(S_3 S_4 \oplus S_2 S_5) \oplus S_2(S_3 S_3 \oplus S_2 S_4) \quad (8A)$$

$$\Delta_{30} = S_1(S_4 S_4 \oplus S_3 S_5) \oplus S_2(S_3 S_4 \oplus S_2 S_5) \oplus S_3(S_3 S_3 \oplus S_2 S_4) \quad (9A)$$

If the value of $\Delta_{33}$ is 0, then Equation (4A) is a dependent set which implies that there are fewer than three errors. In that case, the syndromes will be processed for two errors where the parameters will be processed for two errors where the parameters $\Delta_{22}$, $\Delta_{21}$ and $\Delta_{20}$ are derived from similar equations for the case of two errors and are given by $$\Delta_{22} = S_1 S_1 \oplus S_2 S_0 \quad (10A)$$

$$\Delta_{21} = S_0 S_3 \oplus S_1 S_2 \quad (11A)$$

$$\Delta_{20} = S_1 S_3 \oplus S_2 S_2 \quad (12A)$$

Note that these are cofactors of $\Delta_{33}$ as seen from Equation (6A) which can be rewritten as $$\Delta_{33} = S_2 \Delta_{20} \oplus S_3 \Delta_{21} \oplus S_4 \Delta_{22} \quad (13A)$$

Thus, the values $\Delta_{22}$, $\Delta_{21}$ and $\Delta_{20}$ for the case of two errors need not be computed separately. They are available as byproducts of the computation for $\Delta_{33}$. Similarly, $\Delta_{11}$ and $\Delta_{10}$ for the case of one error are given by $$\Delta_{11} = S_0 \quad (14A)$$

$$\Delta_{10} = S_1 \quad (15A)$$

which are cofactors of $\Delta_{22}$ and are also readily available as syndromes.

Let v denote the exact number of errors, which may be 3, 2, 1 or 0.

The exact number of errors is determined as follows:

$$v = 3 \text{ if } \Delta_{33} \neq 0 \quad (16A)$$

$$v = 2 \text{ if } \Delta_{33} = 0 \text{ and } \Delta_{22} \neq 0$$

$$v = 1 \text{ if } \Delta_{33} = \Delta_{22} = 0 \text{ and } \Delta_{11} \neq 0$$

$$v = 0 \text{ if } \Delta_{33} = \Delta_{22} = \Delta_{11} = 0$$

The special cases of two and one errors can be accomodated automatically by selecting appropriate determinants. To this end, let $\Delta_3$, $\Delta_2$, $\Delta_1$ and $\Delta_0$ be defined as $$\Delta_3 = \Delta_{33} \quad (17A)$$

$$\Delta_2 = \Delta_{32} \text{ if } v = 3 \quad (18A)$$

$$\Delta_1 = \begin{cases} \Delta_{22} \text{ if } v = 2 \\ \Delta_{31} \text{ if } v = 3 \\ \Delta_{21} \text{ if } v = 2 \\ \Delta_{11} \text{ if } v = 1 \end{cases} \quad (19A)$$

$$\Delta_0 = \begin{cases} \Delta_{30} \text{ if } v = 3 \\ \Delta_{20} \text{ if } v = 2 \\ \Delta_{10} \text{ if } v = 1 \end{cases} \quad (20A)$$

Then equation (5A) can be rewritten as $$\sigma_0 = \frac{\Delta_0}{\Delta_v}, \quad \sigma_1 = \frac{\Delta_1}{\Delta_v} \text{ and } \sigma_2 = \frac{\Delta_2}{\Delta_v} \quad (21A)$$

Conventionally, the error locator polynomial (3A) with the coefficients $\sigma_0$, $\sigma_1$ and $\sigma_2$ of equation (21A) is used to determine error locations through the well known Chien search procedure. However, the error locator equation can be modified in order to avoid the division by $\Delta_v$. The modified error locator equation is given as $$\Delta_3 \alpha^{3i} \oplus \Delta_2 \alpha^{2i} \oplus \Delta_1 \alpha^i \oplus \Delta_0 = 0 \quad (22A)$$

The error location numbers are the set of $v$ unique values of i which satisfy Equation (22A).

Next an expression is derived for the error values $E_{i1}$, $E_{i2}$ and $E_{i3}$. From Equations (1A) for $j = 0, 1$ and $2$ $$\begin{bmatrix} 1 & 1 & 1 \\ \alpha^{i1} & \alpha^{i2} & \alpha^{i3} \\ \alpha^{2i1} & \alpha^{2i2} & \alpha^{2i3} \end{bmatrix} \begin{bmatrix} E_{i1} \\ E_{i2} \\ E_{i3} \end{bmatrix} = \begin{bmatrix} S_0 \\ S_1 \\ S_2 \end{bmatrix} \quad (23A)$$

Solving (23A) for $E_{i1}$ $$E_{i1} = \frac{S_0 \alpha^{i2+i3} \oplus S_1(\alpha^{i2} \oplus \alpha^{i3}) \oplus S_2}{\alpha^{i2+i3} \oplus \alpha^{i1}(\alpha^{i2} \oplus \alpha^{i3}) \oplus \alpha^{2i1}} \quad (24A)$$

From Equation (2A)

$$\sigma_0 = \alpha^{i1+i2+i3} \quad (25A)$$

$$\sigma_2 = \alpha^{i1} \oplus \alpha^{i2} \oplus \alpha^{i3} \quad (26A)$$

From Equations (24A), (25A) and (26A)

$$E_{i1} = \frac{S_0 \sigma_0 \oplus \alpha^{i1} S_1 \sigma_2 \oplus \alpha^{2i1} S_1 \oplus {}^{i1} S_2}{\sigma_0 \oplus \alpha^{2i1} \sigma_2} \quad (27A)$$

Using Equation (5A) Equation (27A) can be reduced to $$E_{i1} = \frac{S_0 \Delta_0 \oplus (S_1 \Delta_2 \oplus S_2 \Delta_3) \alpha^{i1} \oplus S_1 \Delta_3 \alpha^{2i1}}{\Delta_0 \oplus \Delta_2 \alpha^{2i1}} \quad (28A)$$

Notice that the error value $E_{i1}$ in Equation (28A) is expressed in terms of $i_1$ and hence it can be computed without explicit values for $i_2$ and $i_3$. The other error values $E_{i2}$ and $E_{i3}$ have similar expressions. A more general expression for error value is obtained by rewriting Equation (28A) with a running variable i in place of $i_1$ as follows:

$$E_i = \frac{\Phi_0 \oplus \Phi_1 \alpha^i \oplus \Phi_2 \alpha^{2i}}{\Delta_0 \oplus \Delta_2 \alpha^{2i}} \quad (29A)$$

where the coefficients $\Phi_0$, $\Phi_1$ and $\Phi_2$ are given by $$\Phi_0 = S_0 \Delta_0 \quad (30A)$$

$$\Phi_1 = S_1 \Delta_2 \oplus S_2 \Delta_3 \quad (31A)$$

$$\Phi_2 = S_1 \Delta_3 \quad (32A)$$

The Equation (29A) makes it possible to combine the conventional Step 4 with Step 3 of the decoding process where the error values $E_{i1}$, $E_{i2}$ and $E_{i3}$ are computed in synchronism with the "Chien Search" of the error locations.

The syndrome decoder then consists of computation of various quantities in Equations (22A) and (29A) for each value of i in a cyclic iterative manner and then affecting the correction of an outgoing symbol with $E_i$ whenever Equation (22A) is satisfied.

The General Case of t Errors

The following is the mathematical derivation for the general case to establish that the logic set forth in FIGS. 2, 3, 4 and 5 for the special case of up to three errors is applicable in general for t errors.

In a general BCH or Reed-Solomon code, the codeword consists of n-symbols which include r check symbols corresponding to the roots $\alpha^a$, $\alpha^{a+1}$, $\alpha^{a+2}$, ..., $\alpha^{a+r-1}$ of the generator polynomial where $\alpha$ is an element of the Galois field GF(256). The integer a will be taken to be zero, although all of the following results can be derived with any value of a. The corresponding syndromes are denoted by $S_0$, $S_1$, $S_2$, ..., $S_{r-1}$ respectively. The syndromes can be computed from the received codeword as $$S_j = \sum_{i=0}^{n-1} \alpha^{ji} \hat{B}_i \quad j = 0, 1, 2, \ldots, (r-1) \quad (1B)$$

where $\hat{B}_0$, $\hat{B}_1$, $\hat{B}_2$, ..., $\hat{B}_{n-1}$ are the n-symbols of the received codeword.

Let $v$ denote the actual number of symbols in error in a given codeword. The error values are denoted by $E_i$ where i represents an error location value from a set of $v$ different error locations given by $\{I\} = \{i_1, i_2, \ldots, i_v\}$. The relationship between syndromes and the errors are then given by $$S_j = \sum_{i \in \{I\}} \alpha^{ji} E_i \quad j = 0, 1, 2, \ldots, (r-1) \quad (2B)$$

Any non-zero value of a syndrome indicates the presence of errors. The decoder processes these syndromes in order to determine the locations and values of the errors. Let t denote the maximum number of errors that can be decoded without ambiguity. A set of $r = 2t$ syndromes are required to determine the locations and values of t errors.

Consider the polynomial with roots at $\alpha^i$ where $i \in \{I\}$. This is called the error locator polynomial defined as $$\pi_{i\epsilon\{I\}} (1 - \alpha^{-i}x) = \sum_{m=0}^{v} \sigma_m x^m = \sum_{m=0}^{t} \sigma_m x^m \qquad (3B)$$

where $\sigma_0=1$, $\sigma_v \neq 0$ and for $m>v$, $\sigma_m=0$. The unknown coefficients $\sigma_m$ for $m \leq v$ can be determined from the syndromes of Equation 1B as shown below.

Substituting $x=\alpha^i$ in Equation 3B we get $$\sum_{m=0}^{t} \sigma_m \alpha^{mi} = 0 \text{ for } i \epsilon \{I\}. \qquad (4B)$$

Using Equations 2B and 4B, it is easy to show that the syndromes $S_j$ and the coefficients $\sigma_m$ of the error locator polynomial satisfies the following set of relationships:

$$\sum_{m=0}^{t} \sigma_m S_{m+k} = 0 \text{ for } k = 0, 1, \ldots, t-1 \qquad (5B)$$

The set of equations 5B can be rewritten in matrix notation as $$\begin{bmatrix} S_0 & S_1 \ldots S_t \\ S_1 & S_2 \ldots S_{t+1} \\ \vdots & \vdots \\ S_{t-1} & S_t \ldots S_{2t-1} \end{bmatrix} \begin{bmatrix} \sigma_0 \\ \sigma_1 \\ \vdots \\ \sigma_{t-1} \\ \sigma_t \end{bmatrix} = 0 \qquad (6B)$$

Let M denote the $t\times(t+1)$ syndrome matrix on left side of Equation 6B. Let $M_t$ denote the square matrix obtained by eliminating the last column in matrix M. If $M_t$ is nonsingular, then the above set of equations can be solved using Cramer's rule to obtain $$(\sigma_m/\sigma_t) = \Delta_{tm}/\Delta_{tt} \qquad (7B)$$

for $m=0, 1, \ldots t-1$
where $\Delta_{tt}$ is the non-zero determinant of matrix $M_t$ and $\Delta_{tm}$ denotes the determinant of the matrix obtained by replacing the $m^{th}$ column in matrix $M_t$ by negative of the last column of the syndrome matrix M for each $m=0, 1, \ldots, t-1$.

If matrix $M_t$ is singular, (i.e., $\Delta_{tt}$ is 0) then Equation 5B is a dependent set which implies that there are fewer than t errors. In that case, $\sigma_t$ is 0. We can delete $\sigma_t$ and last row and last column of the syndrome matrix in 6B. The resulting matrix equation corresponds to that for $t-1$ errors. This process is repeated if necessary so that the final matrix equation corresponds to that for v errors and M is nonsingular. Then we need the set of determinants $\Delta_{vm}$ where $m=0, 1, \ldots, v$.

It can be easily seen that $\Delta_{vm}$ for $v=t-1$ is a cofactor of $\Delta_{tt}$ corresponding to the $(m-1)^{st}$ column and $t^{th}$ row in matrix $M_t$. We can express $\Delta_{tt}$ in terms of these cofactors:

$$\Delta_{tt} = \sum_{m=0}^{t-1} S_{t-1+m}\Delta_{(t-1)m} \qquad (8B)$$

Thus the values $\Delta_{vm}$ for $v=t-1$ need not require separate computations. They are available as byproduct of the computation for $\Delta_{tt}$. In fact, $\Delta_{vm}$ for subsequent smaller values of v are all available as byproducts of the computation for $\Delta_{tt}$ through the hierarchical relationships of lower order cofactors. Thus, in case of fewer errors, the decoder finds $\Delta_{tt}=0$ and automatically back tracks into prior computations to the correct value for v and uses the already computed cofactors $\Delta_{vm}$. This is illustrated previously through hardware implmentation of the case $t=3$.

In order to accomodate the special cases of all fewer errors, we will replace Equation 7B by a more convenient general form $$(\sigma_m/\sigma_v) = \Delta_m/\Delta_v \qquad (9B)$$

for $m=0, 1, 2, \ldots, t$
where v is determined from the fact that $\Delta_{mm}=0$ for all $m>v$ and $\Delta_{vv}\neq 0$; and $\Delta_m$ is defined with the new notation as $$\Delta_m = \begin{bmatrix} \Delta_{mm} & \text{for } m > v \\ \Delta_{vm} & \text{for } m \leq v \end{bmatrix} \qquad (10B)$$

Since $\sigma_0=1$, one can determine $\sigma_m$ for all values of m using Equation 9B. However, we will see that the coefficients $\sigma_m$ are not needed in the entire decoding process. To this end, we obtain a modified error locator equation from Equations 4B and 9B as given by $$\sum_{m=0}^{t} \Delta_m \alpha^{mi} = 0 \text{ for } i \epsilon \{I\} \qquad (11B)$$

The error location values $i_\epsilon\{I\}$ are the set of v unique values of i which satisfy Equation 11B.

The error locator polynomial as defined by Equation 2B has v roots corresponding to v error location values. Consider a polynomial which has all roots of the error locator polynomial except one corresponding to the location value $i=j$. This polynomial is defined as $$\pi_{\substack{i\epsilon\{I\} \\ i\neq j}} (1 - \alpha^{-i}x) = \sum_{m=0}^{v-1} \sigma_{j,m} x^m = \sum_{m=0}^{t-1} \sigma_{j,m} x^m \qquad (12B)$$

When the actual number of error locations v is less than t, the coefficients $\sigma_{j,m}$ are 0 for $m=v, \ldots, t-1$. This is done in order to affect processing of all values of v through a single set of hardware. Substituting $x=\alpha^i$ in Equation 12B we get $$\sum_{m=0}^{t-1} \sigma_{j,m} \alpha^{mi} = 0 \text{ for } i\epsilon\{I\}, i \neq j \qquad (13B)$$

Examine an expression similar to one in Equation 5B involving the syndromes $S_j$ and the coefficients $\sigma_{j,m}$ of the new polynomial. Using Equation 2B, we substitute for $S_m$ and get $$\sum_{m=0}^{t-1} \sigma_{j,m} S_m = \sum_{m=0}^{t-1} \sigma_{j,m} \left( \sum_{i\epsilon\{I\}} \alpha^{mi} E_i \right) \qquad (14B)$$

Interchanging the order of summing parameters m and i in Equation 14B we get $$\sum_{m=0}^{t-1} \sigma_{j,m} S_m = \sum_{i \in \{I\}} E_i \left( \sum_{m=0}^{t-1} \sigma_{j,m} \alpha^{mi} \right) \tag{15B}$$

Now using Equations 13B and 15B we obtain $$\sum_{m=0}^{t-1} \sigma_{j,m} S_m = E_j \sum_{m=0}^{t-1} \sigma_{j,m} \alpha^{mj} \tag{16B}$$

Thus we have an expression for the error values $$E_j = \left( \sum_{m=0}^{t-1} \sigma_{j,m} S_m \right) / \left( \sum_{m=0}^{t-1} \sigma_{j,m} \alpha^{mj} \right) \tag{17B}$$

The above expression for error values is well-known. We will reduce it further to obtain a more convenient form. To this end, we prove the following Lemmas 1, 2 and 3.

In Lemma 1, we obtain a relation which expresses the coefficients $\sigma_{j,m}$ in terms of the known coefficients $\sigma_k$ of the error locator polynomial.

Lemma 1

$$\sum_{k=0}^{m} \sigma_k \alpha^{kj} = \sigma_{j,m} \alpha^{mj} \text{ for } 0 \leq m < t \tag{18B}$$

Proof: From the definitions of polynomials in Equations 3B and 12B we have $$\sum_{m=0}^{t} \sigma_m x^m = (1 - \alpha^{-j}x) \sum_{m=0}^{t-1} \sigma_{j,m} x^m \tag{19B}$$

Comparing the coefficients of each term in the polynomials on the two sides of equation 19B we have $$\sigma_m = \begin{cases} \sigma_{j,m} - \sigma_{j,m-1} \alpha^{-j} & \text{for } 0 < m < t \\ \sigma_{j,m} & \text{for } m = 0 \end{cases} \tag{20B}$$

Using Equation 20B, we can substitute for $\sigma_k$ and obtain $$\sum_{k=0}^{m} \sigma_k \alpha^{kj} = \sigma_{j,0} + \tag{21B}$$

$$\sum_{k=1}^{m} (\sigma_{j,k} \alpha^{kj} - \sigma_{j,k-1} \alpha^{(k-1)j}) \text{ for } 0 \leq m \leq t$$

On eliminating the cancelling terms from Equation 21B we get $$\sum_{k=0}^{m} \sigma_k \alpha^{kj} = \sigma_{j,m} \alpha^{mj} \text{ for } 0 \leq m < t \tag{22B}$$

This completes the proof of Lemma 1.
Next we rewrite the denominator of the expression in Equation 17B using the result of Lemma 1.

Lemma 2

$$\sum_{m=0}^{t-1} \sigma_{j,m} \alpha^{mj} = \sum_{k=0}^{t} - k \sigma_k \alpha^{kj} \tag{23B}$$

Proof: Using Lemma 1 we obtain $$\sum_{m=0}^{t-1} \sigma_{j,m} \alpha^{mj} = \sum_{m=0}^{t-1} \left( \sum_{k=0}^{m} \sigma_k \alpha^{kj} \right) \tag{24B}$$

Interchanging the order of summing parameters m and k, we get $$\sum_{m=0}^{t-1} \sigma_{j,m}\alpha^{mj} = \sum_{k=0}^{t-1} \sigma_k \alpha^{kj} \left( \sum_{m=k}^{t-1} 1 \right) = \sum_{k=0}^{t-1} (t-k) \sigma_k \alpha^{kj} \tag{25B}$$

Using Equation 4B, we can rewrite Equation 25B as $$\sum_{m=0}^{t-1} \sigma_{j,m}\alpha^{mj} = -t\sigma_t\alpha^{tj} + \sum_{k=0}^{t-1} -k\sigma_k\alpha^{kj} = \sum_{k=0}^{t} -k\sigma_k\alpha^{kj} \tag{26B}$$

This completes the proof of Lemma 2.
Now we use the result of Lemma 1 and obtain a more convenient expression for the numerator in Equation 17B in the following Lemma.

Lemma 3

$$\sum_{m=0}^{t-1} \sigma_{j,m}S_m = - \sum_{m=-\mu}^{t-1-\mu} \alpha^{mj} \left( \sum_{k=m+\mu+1}^{t} \sigma_k S_{k-m} \right) \tag{27B}$$

for $0 \leq \mu < t$

Proof: Using Lemma 1 we can express $\sigma_{j,m}$ in terms of $\sigma_k$. On substituting these values we obtain $$\sum_{m=0}^{t-1} \sigma_{j,m} S_m = \sum_{m=0}^{t-1} S_m \left( \sum_{k=0}^{m} \sigma_k \alpha^{kj} \right) \alpha^{-mj} \tag{28B}$$

Let RHS denote the right-hand side of Equation (28B) In order to prove the Lemma, we rearrange RHS. First, we use the result from Equation 4B and rewrite some of the terms in RHS (the terms with $m > \mu$) as $$RHS = \sum_{m=0}^{\mu} S_m \left( \sum_{k=0}^{m} \sigma_k \alpha^{kj} \right) \alpha^{-mj} + \tag{29B}$$

$$\sum_{m=\mu+1}^{t-1} S_m \left( - \sum_{k=m+1}^{t} \sigma_k \alpha^{kj} \right) \alpha^{-mj}$$

Then, substituting k by m+h in the above RHS becomes $$RHS = \sum_{m=0}^{\mu} S_m \left( \sum_{h=-m}^{0} \sigma_{m+h} \alpha^{hj} \right) + \tag{30B}$$

-continued $$\sum_{m=\mu+1}^{t-1} S_m \left( -\sum_{h=1}^{t-m} \sigma_{m+h} \alpha^{hj} \right)$$

Interchanging the order of summing parameters m and h, we obtain another form for RHS as $$RHS = \sum_{h=-\mu}^{0} \alpha^{hj} \left( \sum_{m=-h}^{\mu} \sigma_{m+h} S_m \right) + \qquad (31B)$$

$$\sum_{h=1}^{t-\mu-1} \alpha^{hj} \left( -\sum_{m=\mu+1}^{t-h} \sigma_{m+h} S_m \right)$$

Substituting m by k−h, the expression RHS becomes $$RHS = \sum_{h=-\mu}^{0} \alpha^{hj} \left( \sum_{k=0}^{\mu+h} \sigma_k S_{k-h} \right) + \qquad (32B)$$

$$\sum_{h=1}^{t-\mu-1} \alpha^{hj} \left( \sum_{k=\mu+h+1}^{t} -\sigma_k S_{k-h} \right)$$

However, from Equation 5B we have $$\sum_{k=0}^{\mu+h} \sigma_k S_{k-h} = \sum_{k=\mu+h+1}^{t} -\sigma_k S_{k-h} \qquad (33B)$$

for $h \leq 0$ and $0 \leq \mu + h < t$

Thus using Equation 33B in 32B we have the final form for RHS:

$$RHS = \sum_{h=-\mu}^{t-\mu-1} \alpha^{hj} \left( \sum_{k=\mu+h+1}^{t} -\sigma_k S_{k-h} \right) \qquad (34B)$$

for $0 \leq \mu < t$

This completes the proof of Lemma 3.
We also have the following corollary of Lemma 3 from Equation 32B Corollary:
$$\sum_{m=0}^{t-1} \sigma_{j,m} S_m = \sum_{m=-\mu}^{t-1-\mu} \phi_m \alpha^{mj} \qquad (35B)$$

where $0 \leq \mu < t$ and the coefficients $\phi_m$ are given by $$\phi_m = \begin{bmatrix} \sum_{k=0}^{\mu+m} \sigma_k S_{k-m} \text{ for } m \leq 0 \\ \sum_{k=\mu+m+1}^{t} -\sigma_k S_{k-m} \text{ for } m > 0 \end{bmatrix} \qquad (36B)$$

Lemma 3 and its corollary provides a family of expressions for the numerator in Equation 17B through a choice of values for $\mu$. We make the following observations:

(a) The expression in Lemma 3 requires the syndromes $S_{\mu+1}, S_{\mu+2}, \ldots, S_{\mu+t}$; whereas the expression in the corollary requires the syndromes $S_0, S_1, \ldots, S_{t-1}$. This is especially important in the case of erasure correction.

(b) The expression in the corollary requires fewer number of multiplications of the type $\sigma_k S_{k-m}$ compared to the expression in Lemma 3. In the corollary, this number depends on the choice of $\mu$ and is the minimum when $\mu = \underline{\mu}$ where $\underline{\mu}$ is the largest integer under t/2. The number of multiplications with the choice $\mu = \underline{\mu}$ is the integer closest to $(t^2+2t)/4$.

(c) The cases of fewer errors ($v < t$) are automatically processed by the same hardware as that for processing t errors. With a given choice of $\mu$, the same hardware can be also used in applications with a smaller set of syndromes, $S_0, S_1, \ldots, S_{t1}$ and up to t1 errors provided that $t < t1 > \mu$. From this point of view, lower values of $\mu$ are desirable and the choice of $\mu = 0$ offers the maximum flexibility in applicability of the decoder hardware. The number of multiplications required by the expression in the corollary with $\mu = 0$ is $(t^2-t+2)/2$ which is less than two times the minimum of $(t^2+2t)/4$ when $\mu = \underline{\mu}$.

In view of the above observations, we will use expression in the corollary of Lemma 3 in decoder implementation. For large values of t, it is advisable to use $\mu = \underline{\mu}$ for the greatest economy in hardware. In case of small values of t, we use $\mu = 0$ for flexibility in being able to reduce the value of t, later if necessary, without modifying the already fabricated hardware.

Now we can rewrite Equation 17B using the results of Lemma 2 and the corollary of Lemma 3 with $\mu = 0$. As a result, any error value $E_i$ can be expressed as $$E_i = \left( \sum_{m=0}^{t-1} \phi_m \alpha^{mi} \right) / \left( \sum_{m=0}^{t} -m\sigma_m \alpha^{mi} \right) \qquad (37B)$$

where $$\phi_m = \begin{bmatrix} \sigma_0 S_0 \text{ for } m = 0 \\ \sum_{k=m+1}^{t} -\sigma_k S_{m-k} \text{ for } m > 0 \end{bmatrix} \qquad (38B)$$

In view of Equation 9A, the above expressions can be normalized to obtain error values in terms of $\Delta_m$ as follows:

$$E_i = \left( \sum_{m=0}^{t-1} \phi_m \alpha^{mi} \right) / \left( \sum_{m=0}^{t} -m\Delta_m \alpha^{mi} \right) \qquad (39B)$$

where $$\phi_m = \begin{bmatrix} \Delta_0 S_0 \text{ for } m = 0 \\ \sum_{k=m+1}^{t} -\Delta_k S_{k-m} \text{ for } m > 0 \end{bmatrix} \qquad (40B)$$

In case of binary base field, the terms with even values of m, (m mod 2=0) in the denomination of Equation 39B vanish. The resultant expression for $E_j$ for binary base field is $$E_i = \left( \sum_{m=0}^{t-1} \phi_m \alpha^{mi} \right) / \left( \sum_{m=0}^{t} \Delta_m \alpha^{mi} \right) \qquad (41B)$$

m odd

-continued where $$\phi_m = \begin{bmatrix} \Delta_0 S_0 \text{ For } m = 0 \\ \sum_{k=m+1}^{t} \Delta_k S_{k-m} \text{ For } m > 0 \end{bmatrix} \quad (42B)$$

Note that the computations for the denominator in Equation 41B is already available as a byproduct from the computations of Equation 11B for each value of i in the Chien Search of error locations. The numerator for each value of i can be computed and multiplied by the inverse of the denominator in synchronism with the search for error locations. The resultant $E_i$ is used for correction of the outgoing $i^{th}$ data symbol $B_i$ whenever the error locator Equation 11B is satisfied.

Table 2 which follows lists 255 non-zero elements of $GF(2^8)$, each with the corresponding inverse element. A primitive polynomial $p(x) = x^8 + x^7 + x^5 + x^3 + 1$ was used to generate these elements. The elements are represented by 8-digit binary vectors which in polynomial notation have the coefficient for the high order term on the left. The inverse function of this table was implemented through block 40 using the conventional 8-bit encode-decode logic. This requires at the most 304 AND-gates and 494 OR-gates.

While the invention has been particularly shown and described with reference to a preferred embodiment thereof, it will be understood by those skilled in the art that various other changes in the form and details may be made therein without departing from the spirit and scope of the invention.

Table 2

| S | S⁻¹ | S | S⁻¹ | S | S⁻¹ | S | S⁻¹ | S | S⁻¹ |
|---|---|---|---|---|---|---|---|---|---|
| 00000001 | 00000001 | 00110100 | 11001100 | 01100111 | 00100000 | 10011010 | 10101011 | 11001101 | 00001001 |
| 00000010 | 11010100 | 00110101 | 00001000 | 01101000 | 01100110 | 10011011 | 10111110 | 11001110 | 00010000 |
| 00000011 | 10011000 | 00110110 | 01101110 | 01101001 | 00100001 | 10011100 | 00100110 | 11001111 | 11011000 |
| 00000100 | 01101010 | 00110111 | 01101100 | 01101010 | 00000100 | 10011101 | 10000001 | 11010000 | 00110011 |
| 00000101 | 11101111 | 00111000 | 10100001 | 01101011 | 11101110 | 10011110 | 11001010 | 11010001 | 10001100 |
| 00000110 | 01001100 | 00111001 | 11110000 | 01101100 | 00110011 | 10011111 | 01011111 | 11010010 | 11000100 |
| 00000111 | 11111110 | 00111010 | 10000110 | 01101101 | 01101111 | 10100000 | 11110001 | 11010011 | 00101101 |
| 00001000 | 00110101 | 00111011 | 10101000 | 01101110 | 00110110 | 10100001 | 00111000 | 11010100 | 00000010 |
| 00001001 | 11001101 | 00111100 | 11100100 | 01101111 | 01101101 | 10100010 | 01000111 | 11010101 | 10011001 |
| 00001010 | 10100011 | 00111101 | 01001111 | 01110000 | 10000000 | 10100011 | 00001010 | 11010110 | 01110110 |
| 00001011 | 01000110 | 00111110 | 10001001 | 01110001 | 00010101 | 10100100 | 11101010 | 11010111 | 01010101 |
| 00001100 | 00100110 | 00111111 | 00101111 | 01110010 | 01111000 | 10100101 | 00011101 | 11011000 | 11001111 |
| 00001101 | 01100010 | 01000000 | 10001111 | 01110011 | 10101111 | 10100110 | 10011100 | 11011001 | 00010001 |
| 00001110 | 01111111 | 01000001 | 10000010 | 01110100 | 01000011 | 10100111 | 10000000 | 11011010 | 11100011 |
| 00001111 | 11000010 | 01000010 | 11100000 | 01110101 | 11100001 | 10101000 | 00111011 | 11011011 | 11011111 |
| 00010000 | 11001110 | 01000011 | 01101110 | 01110110 | 01010100 | 10101001 | 10000111 | 11011100 | 00011011 |
| 00010001 | 11011001 | 01000100 | 01011100 | 01110111 | 11010110 | 10101010 | 10111111 | 11011101 | 00110110 |
| 00010010 | 10110010 | 01000101 | 11000001 | 01111000 | 01110010 | 10101011 | 10011010 | 11011110 | 11100010 |
| 00010011 | 00011000 | 01000110 | 00001011 | 01111001 | 10101110 | 10101100 | 11101001 | 11011111 | 11011011 |
| 00010100 | 10000101 | 01000111 | 10100010 | 01111010 | 11101111 | 10101101 | 11100000 | 11100000 | 01000010 |
| 00010101 | 01110001 | 01001000 | 11111000 | 01111011 | 01010110 | 10101110 | 01111001 | 11100001 | 01110101 |
| 00010110 | 00100011 | 01001001 | 11001000 | 01111100 | 10010000 | 10101111 | 01110011 | 11100010 | 11011110 |
| 00010111 | 10111101 | 01001010 | 10001111 | 01111101 | 01010010 | 10110000 | 01011011 | 11100011 | 11011010 |
| 00011000 | 00010011 | 01001011 | 01010000 | 01111110 | 11000011 | 10110001 | 10111100 | 11100100 | 00111100 |
| 00011001 | 10110011 | 01001100 | 00000110 | 01111111 | 00001110 | 10110010 | 00010010 | 11100101 | 01001110 |
| 00011010 | 00110001 | 01001101 | 11111111 | 10000000 | 10100111 | 10110011 | 00011001 | 11100110 | 10000011 |
| 00011011 | 11011100 | 01001110 | 11100101 | 10000001 | 10011101 | 10110100 | 11000010 | 11100111 | 01000000 |
| 00011100 | 11101011 | 01001111 | 00111101 | 10000010 | 01000001 | 10110101 | 11111100 | 11101000 | 11110101 |
| 00011101 | 10100101 | 01010000 | 01001011 | 10000011 | 11100110 | 10110110 | 01011000 | 11101001 | 10101100 |
| 00011110 | 01100001 | 01010001 | 10010001 | 10000100 | 01111010 | 10110111 | 00100101 | 11101010 | 10100100 |
| 00011111 | 10111011 | 01010010 | 01111101 | 10000101 | 00010100 | 10111000 | 00100010 | 11101011 | 00011100 |
| 00100000 | 01100111 | 01010011 | 10010001 | 10000110 | 00111010 | 10111001 | 00010111 | 11101100 | 00101010 |
| 00100001 | 01101001 | 01010100 | 01110110 | 10000111 | 10101001 | 10111010 | 01100101 | 11101101 | 11110111 |
| 00100010 | 10111000 | 01010101 | 11010111 | 10001000 | 00101110 | 10111011 | 00011111 | 11101110 | 01101011 |
| 00100011 | 00010110 | 01010110 | 01111011 | 10001001 | 00111110 | 10111100 | 10110001 | 11101111 | 00000101 |
| 00100100 | 01011001 | 01010111 | 11110010 | 10001010 | 10110100 | 10111101 | 00010111 | 11110000 | 00111001 |
| 00100101 | 10110111 | 01011000 | 10110110 | 10001011 | 11111101 | 10111110 | 10011011 | 11110001 | 10100000 |
| 00100110 | 00001100 | 01011001 | 00100100 | 10001100 | 11010001 | 10111111 | 10101010 | 11110010 | 01010111 |
| 00100111 | 01100011 | 01011010 | 10111101 | 10001101 | 00110010 | 11000000 | 01011101 | 11110011 | 01111010 |
| 00101000 | 10010110 | 01011011 | 10110000 | 10001110 | 01010001 | 11000001 | 01000101 | 11110100 | 10101101 |
| 00101001 | 11111010 | 01011100 | 01000100 | 10001111 | 01001010 | 11000010 | 00001111 | 11110101 | 11101000 |
| 00101010 | 11101100 | 01011101 | 11000000 | 10010000 | 01111100 | 11000011 | 01111110 | 11110110 | 00101011 |
| 00101011 | 11110110 | 01011110 | 11001011 | 10010001 | 01010011 | 11000100 | 11010010 | 11110111 | 11101101 |
| 00101100 | 11000101 | 01011111 | 10011111 | 10010010 | 01100100 | 11000101 | 00101100 | 11111000 | 01001000 |
| 00101101 | 11010011 | 01100000 | 10111010 | 10010011 | 10010100 | 11000110 | 11000111 | 11111001 | 11001001 |
| 00101110 | 10001000 | 01100001 | 00011110 | 10010100 | 10010011 | 11000111 | 11000110 | 11111010 | 00101001 |
| 00101111 | 00111111 | 01100010 | 00001101 | 10010101 | 01101101 | 11001000 | 01001001 | 11111011 | 10010111 |
| 00110000 | 11011101 | 01100011 | 00100111 | 10010110 | 00101000 | 11001001 | 11111001 | 11111100 | 10110101 |
| 00110001 | 00011010 | 01100100 | 10010010 | 10010111 | 11111011 | 11001010 | 10011110 | 11111101 | 10001011 |
| 00110010 | 10001101 | 01100101 | 10010101 | 10011000 | 00000011 | 11001011 | 01011110 | 11111110 | 00000111 |
| 00110011 | 11010000 | 01100110 | 01101000 | 10011001 | 11010101 | 11001100 | 00110100 | 11111111 | 01001101 |

Note: S as a polynomial has the high-order term on the left, and is defined by a residue-class modulo p(x), where $p(x) = x^8 + x^7 + x^5 + x^3 + 1$.

Figure A.3 Inverse of field elements S and $S^{-1}$, which are elements of $GF(2^8)$.

Having thus described my invention, what I claim as new and desire to secure by Letters Patent is:

1. A multibyte error correcting system operable to detect up to t errors in a selected codeword containing up to $2^b$ character positions, where each character is represented by a byte consisting of a unique combination of "b" binary bits, by processing 2t syndrome bytes, each containing "b" bits which were generated by combining write check bytes and read check bytes generated respectively when data is written into and read from a storage medium, said check bytes corresponding to the modulo 2 sum of bit positions of said codeword that were selected systematically in accordance with a parity check matrix reflecting the roots $\alpha^a$, $\alpha^{a+1}$, $\alpha^{a+2}$, ..., $\alpha^{a+2t-1}$ of a generator polynomial where $\alpha$ is an element of the finite field of $2^b$ elements, said system including:
   syndrome generating means for generating 2t syndrome bytes from said selected codeword as it is read from the storage medium into said system;
   clocking means for effecting concurrent serial transfer of each byte of said selected codeword read out of said system and each byte of the next codeword read from the storage medium into said system during each clock cycle; and
   error correcting means responsive to said 2t syndrome bytes for correcting during said serial byte transfer from said system up to t erroneous bytes in said selected codeword as said next codeword is entered into said system whereby said selected codeword and said next codeword are processed in a continuous stream of serial bytes.

2. The error correcting system defined in claim 1 further including a buffer interposed between the syndrome generating means and said error correcting means for storing bytes of said codewords during said transfer to and from said system.

3. The system recited in claim 2 in which said buffer is operable to receive up to $2^b$ bytes of information where each byte is defined by b bits.

4. The system recited in claim 1 in which said error correcting means comprises combinatorial logic circuitry for generating t+1 coefficients for an error locator polynomial corresponding to said selected codeword and having t roots which indicate the character positions in said selected codeword containing said t errors.

5. The system recited in claim 4 in which said logic circuitry is operable to generate t+1 coefficients from 2t syndrome bytes to permit correcting up to t errors wherein said logic circuitry operates to identify one character position in said codewords for each error up to t errors.

6. The system recited in claim 4 in which said logic circuitry comprises a plurality of product blocks and a plurality of exclusive-OR blocks, each of said product blocks comprising a plurality of two input AND-gates and a plurality of two input exclusive-OR gates, each of said product blocks providing a "b" bit product output signal from two "b" bit input signals corresponding to said preselected syndrome bytes.

7. The system recited in claim 6 further including first means for combining said product output signals from said product blocks to provide error parameter signals from which said t+1 coefficients of said error locator polynomial are selected.

8. The system recited in claim 7 further including means for selecting from said error parameter signals, said coefficients of said error locator polynomial in accordance with the number of errors in said codeword.

9. The system recited in claim 8 in which said means for selecting includes logic circuitry for indicating the number of said errors.

10. The system recited in claim 4 in which said error correcting means further includes means for developing t error value coefficients $\phi$ from t different preselected syndrome bytes and t different error locator coefficients $\Delta$.

11. The system recited in claim 10 in which said error correcting means further includes a plurality of feedback shift registers, and means for supplying each said error value coefficient $\phi$ to a separate said register, and means for supplying each said error locator coefficient $\Delta$ to a separate said shift register.

12. The system recited in claim 11 in which said clocking means includes a clock pulse generator for supplying a clock pulse to each of said shift registers, each said shift register having a predetermined feedback pattern to cause said coefficients supplied thereto to be shifted a predetermined number of element positions in said $2^b$ finite field each time a clock pulse is supplied to said register, second means for combining the output of said shift registers associated with said error locator coefficients $\Delta$, and means for detecting when the output of said second combining means corresponds to a predetermined element of said finite field.

13. The system recited in claim 12 further including third means for combining the output of selected said shift registers associated with said error value coefficients $\phi$, and fourth means for combining the output of said third combining means with the inverse of the output of selected said registers associated with said error locator coefficients $\Delta$ in accordance with an error value equation to produce an error value during the clock interval that said second combining means provides said output corresponding to said predetermined element of said finite field.

14. A multibyte error correcting method for correcting up to t errors in a selected codeword containing up to $2^b$ character positions, where each character is represented by a byte consisting of a unique combination of "b" binary bits, by processing 2t syndrome bytes, each containing "b" bits which were generated by combining write check bytes and read check bytes generated respectively when data is written into and read from a storage medium, said check bytes corresponding to the modulo 2 sum of bit positions of said codeword that were selected systembatically in accordance with a parity check matrix reflecting the roots $\alpha^a$, $\alpha^{a+1}$, $\alpha^{a+2}$, ..., $\alpha^{a+2t-1}$ of a generator polynomial where $\alpha$ is an element of the finite field of $2^b$ elements, said method comprising:
   generating 2t syndrome bytes from said selected codeword as it is read from the storage medium into said system;
   effecting concurrent serial transfer of bytes of said selected codeword read out from said system and bytes of the next codeword read from the storage medium into said system by a clock signal so that during each clock cycle one byte of said next codeword is transferred into said system and one byte of said selected codeword is transferred out of said system; and correcting up to t erroneous bytes in said selected codeword in response to said 2t syndrome bytes during the transfer of bytes from said system as said next codeword is entered into said system, whereby said selected codeword and said next codeword are processed in a continuous stream of serial bytes.

15. The method recited in claim 14 in which said step of correcting is characterized by at least one byte of said selected codeword being transferred from said system prior to identifying all byte positions of said selected codeword containing errors.

16. The method recited in claim 14 in which said 2t syndrome bytes are converted into t+1 coefficients Δ of an error locator polynomial having roots which identify positions in the codeword containing said errors.

17. The method recited in claim 16 in which said coefficients Δ and said syndrome bytes are employed to develop coefficients Φ for error value equations.

18. The method recited in claim 17 in which each of said coefficients is multiplied by a predetermined different element of said finite field once during each said clock cycle to produce a product result corresponding to another element in the finite field.

19. The method recited in claim 18 in which said product results are logically combined in a predetermined manner to provide an error value signal and an error locator signal, and said error value signal is combined with the byte of data being transferred from said system during the clock cycle in which said error locator signal corresponds to a predetermined pattern.

* * * * *